United States Patent [19]

Skokan

[11] 4,431,928

[45] Feb. 14, 1984

[54] SYMMETRICAL PROGRAMMABLE LOGIC ARRAY

[75] Inventor: Zdenek E. Skokan, Mountain View, Calif.

[73] Assignee: Hewlett-Packard Company, Palo Alto, Calif.

[21] Appl. No.: 276,318

[22] Filed: Jun. 22, 1981

[51] Int. Cl.[3] .......................................... H03K 19/177
[52] U.S. Cl. .................................. 307/465; 307/247 R;
307/303; 357/45
[58] Field of Search ... 357/45; 364/716, 900 MS File;
307/465–469, 445, 303, 454–460, 247 R, 272 A;
377/122–125

[56] References Cited

U.S. PATENT DOCUMENTS

| | | | |
|---|---|---|---|
| 3,902,050 | 8/1975 | Schmidt et al. | 307/465 X |
| 4,034,356 | 6/1977 | Howley et al. | 307/465 |
| 4,124,899 | 11/1978 | Birkner et al. | 364/716 X |
| 4,267,463 | 5/1981 | Mayumi | 307/465 X |
| 4,348,737 | 9/1982 | Cukier et al. | 364/716 X |

OTHER PUBLICATIONS

Mead and Conway, *Introduction to VLSI Systems*, Addison-Wesley Pub. Co., Mass., Oct. 1980, pp. 79–82.
Greenspan et al., "Merged AND/OR Array PLA Using Double Polysilicon FET Process", *IBM T.D.B.*, vol. 23, No. 6, 11-1980, pp. 2189–2191.

*Primary Examiner*—Larry N. Anagnos
*Assistant Examiner*—David R. Hudspeth
*Attorney, Agent, or Firm*—Edward Y. Wong

[57] ABSTRACT

A programmable logic array is provided by symmetrically arraying drivers around the periphery of a substrate. These drivers are essentially OR/NOR gates having latched complementary outputs. The latched complementary outputs enable these logic gates to be implemented into flip-flop elements, and the complementary outputs allow these logic gates to be implemented into AND logic gates. Selectable feedback paths are also provided to add greater flexibility to the programmable logic array. Altogether, the symmetrical logic array provides a simple one-to-one representation of most logic designs to form a universal logic design board in the form of a random logic or programmable state machine.

9 Claims, 9 Drawing Figures

SYMMETRICAL PROGRAMMABLE LOGIC ARRAY

BACKGROUND

In the complex technology of today, many electronics designs require the use of large scale integrated (LSI) circuits. If these LSI circuits are custom designed and implemented, the design process requires a long period of gestation, typically 18 or more months; the circuit consequently becomes very expensive. In the prior art, an effort has been made to reduce the design time and expense of LSI circuits and yet meet the custom requirements of the users. This effort is in the form of a universal logic array where the user, by implementing certain interconnections on a predesigned LSI circuit, achieves a specialized LSI circuit which is essentially custom designed. This is the so-called "Programmable Logic Array (PLA)."

A typical prior art PLA is depicted in FIG. 1A. There, certain logic elements are grouped together in selected areas of the circuit array. This grouping has been determined to best meet the needs of most users. As an example, as shown in FIG. 1A, all the AND gates are grouped together on one side of the array, all the OR gates are grouped together on the opposite side, active elements are grouped in between and adjacent to the AND and OR groups, and input and output terminals are separately grouped on opposite sides of the array.

Although the PLA's of the prior art offer direct correspondence with the Boolean representation of a design, their usefulness as a logic design tool has been limited by small size and slow speed. The size is necessarily small because of the limited number of input and output ports that can be connected to the elements. This limits the number of logic functions that can be implemented. The speed is necessarily limited because of the separate grouping of elements, thereby necessitating less than optimal routing of signals and interconnection of logic elements. Some typical PLA's found in the prior art are as follows.

Texas Instrument (TI) has two types of PLA's, the TMS2000 and the 54S330. The former array has input and output ports numbering 17 and 18, respectively. The 54S330, on the other hand, has 12 input ports and 6 output ports only. The TMS2000 has an array size of 4,560 array cells, whereas the 54S330 has only an array size of 1,500. The TMS2000 is slow; its speed is 1,000 nanoseconds. The 54S330, however, has a speed of 35 nanoseconds.

Intersil and Signetics have PLA's also, the 5200 and the 82S100/200, respectively. The performance and characteristics of these PLA's are very much like the TI54S330: 14 input ports, 8 output ports, 65 nanoseconds and an array size of 728 for the 5200, and 16 input ports, 8 output ports, 35 nanoseconds and an array size of 1,920 for the 82S100/200.

IBM has a PLA that is significantly larger than the preceding ones: an array size of 7,280. Its output and input ports number 16 and 18, respectively. And its speed is 230 nanoseconds.

In contrast to these prior art PLA's, the array in accordance with the preferred embodiment performs with greater speed, viz., 2-5 nanoseconds. Furthermore, the array size is 15,625 and the input and output ports number 100. Unlike the majority of the prior art PLA's, the array in accordance with the invention has feedback elements, up to 500 in the preferred embodiment. It also contains flip flop elements numbering 250. The TI and IBM arrays have flip flop elements numbering only 8 and 13, respectively. Because of the speed, the greater number of input and output ports and greater array size, the array in accordance and with the invention provides a more flexible programmable array to better and more simply match logic designs.

SUMMARY

In accordance with the preferred embodiment of the invention, a universal VLSI circuit without the disadvantages of the prior art is provided. By implementing logic arrays of OR/NOR gates symmetrically, a one-to-one correspondence with gates to a logic circuit can be implemented easily with a simple, single-step via masking process to form interconnections. Furthermore, on-chip state flip-flops can be implemented by a simple connection of a selectable path on that gate. Such a selectable path connects the input and output terminals of the gates for feedback. When these flip flop devices are merged with the OR/NOR elements, as in the preferred embodiment, a programmable state machine instead of a conventional PLA is formed. Another selectable path connects all latch elements into series configuration for purpose of testing.

BRIEF DESCRIPTION OF THE DRAWINGS

3. FIG. 3 illustrates an example of a logic design implemented using the array in accordance with the invention.

DETAILED DESCRIPTION

Figure 1A:
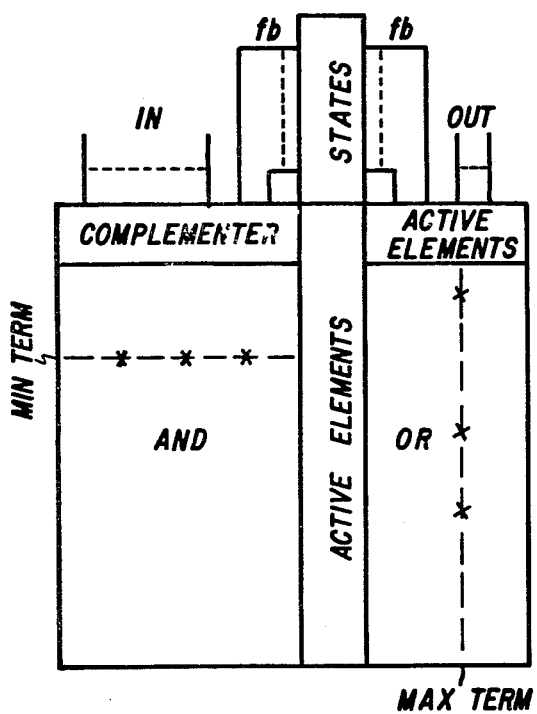
FIG. 1A is an example of a programmable logic array in the prior art.
Figure 1B:
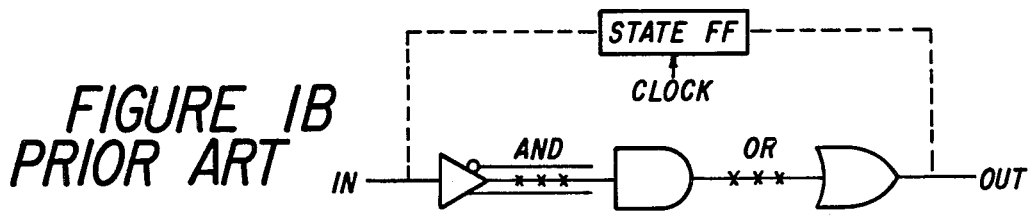
FIG. 1B shows a logic path of the prior art array.

In the prior art PLA's, different functioning logic elements on a substrate are physically separated in the arrays. This type of arrangement is necessitated by the differing materials required to fabricate the differing logic elements. An example of such a situation is illustrated in FIG. 1, where an AND array is separated from an OR array and the two are interconnected through active elements between them. This physical definition of differing functioning logic elements limits both the number of logic elements possible and the speed a signal travels through a logic level in the array.

Figure 2B:
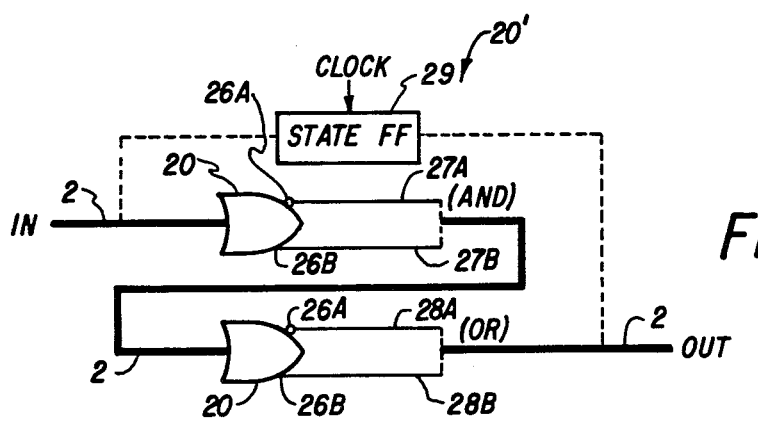
FIG. 2B shows the logic path of the array depicted in FIG. 2A.
Figure 2C:
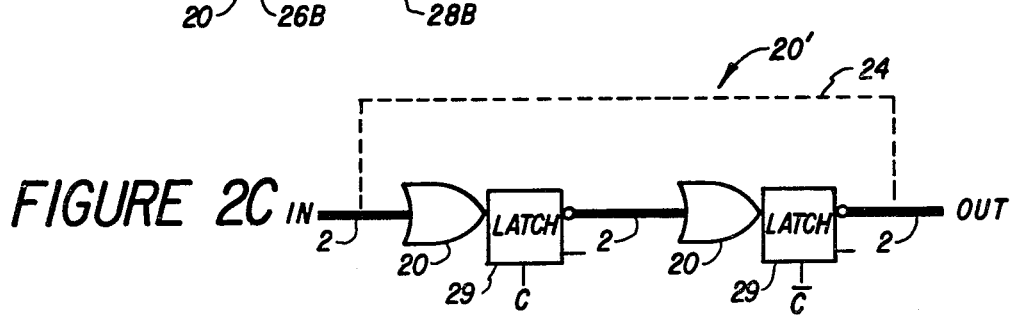
FIG. 2C shows the logic path of FIG. 2B with flip-flops merged with gates.
Figure 2A:
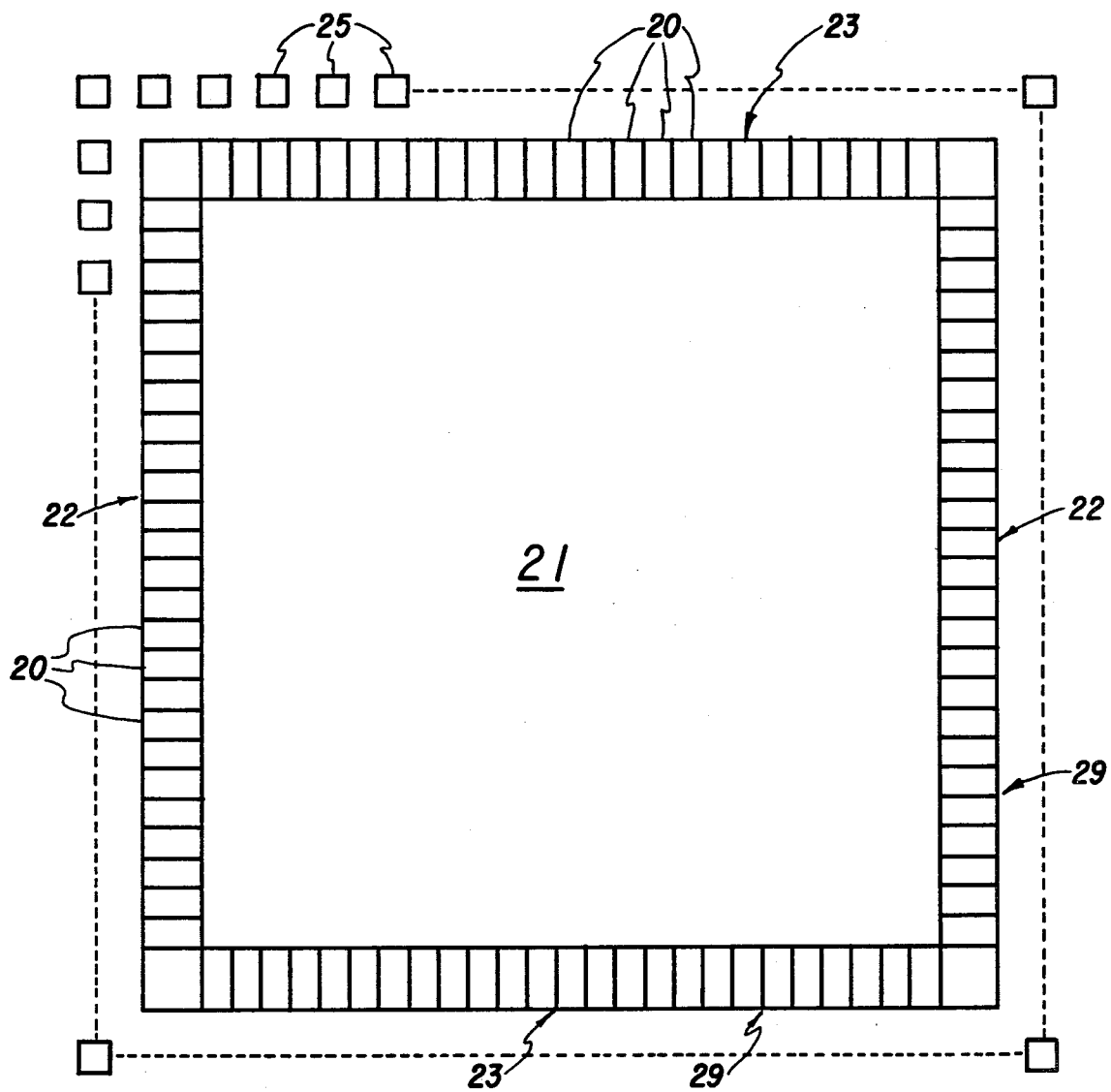
FIG. 2A shows a programmable logic array in accordance with the preferred embodiment of the invention.

In the preferred embodiment of FIG. 2A, interlaced OR gates 20 are arrayed symmetrically around the periphery of a programmable array 21. The input and output lines of these gates, or logic elements, are arrayed so that each logic element 22 in a row can intersect with every logic element 23 in the columns. These input and output lines are typically intersecting at different levels in the substrate forming the programmable array 21, so they are not electrically coupled. To make electrical interconnections at these interconnect cells, or intersections of input/output lines, mask vias are processed at these cells. During this simple one-step process, all the selected interconnections among the logic elements 22, 23 can be simultaneously made to complete implementation of a logic design, thus effectuating a one-to-one logic representation.

To maximize the flexibility of the interconnections of these logic cells, input/output terminals 25, or pads, are arrayed around the symmetrically arrayed gates 20. During the mask via process, connections to the input and output terminals can also be made.

In accordance with the preferred embodiment of the invention, the logic path 2 as shown in FIG. 2B includes OR gates 20 having complementary outputs 26A and 26B, that is, having an additional inverted output terminal to make them OR/NOR gates. These gates 20 are interlaced on a substrate, and the gates can function either as an OR gate or an AND gate, depending on the user's selection of connections 27A, 27B, 28A and/or 28B in array 21. The result of this novel array of logic elements 20' is a symmetrical array that contains a great number of identical logic elements. Furthermore, a more uniform topology and a reduced number of active elements in the symmetrical array in accordance with the invention result in higher density and greater speed than comparable prior art arrays.

FIG. 2C shows the logic path 2 as a merging of OR/NOR gates 20 with flip-flop devices 29. In the preferred embodiment, instead of simple OR/NOR gates, the logic elements 20' are really drivers having logic functions and feedback capability. The gates 20 can be connected with feedback which forms a latching circuit 29 at the output of the gate 20; they then become one integral part. Hence, again by implementing a selected electrical interconnection, in this case a selectable feedback path 24, the final functional form of the logic element is determined. And because of the proximity of the input/output terminals 25 and the merging of the gate 20 and latch 29 into one active element, the logic elements 20' can be grouped closely together advantageously for speed and for less parasitic losses.

Figure 3A:
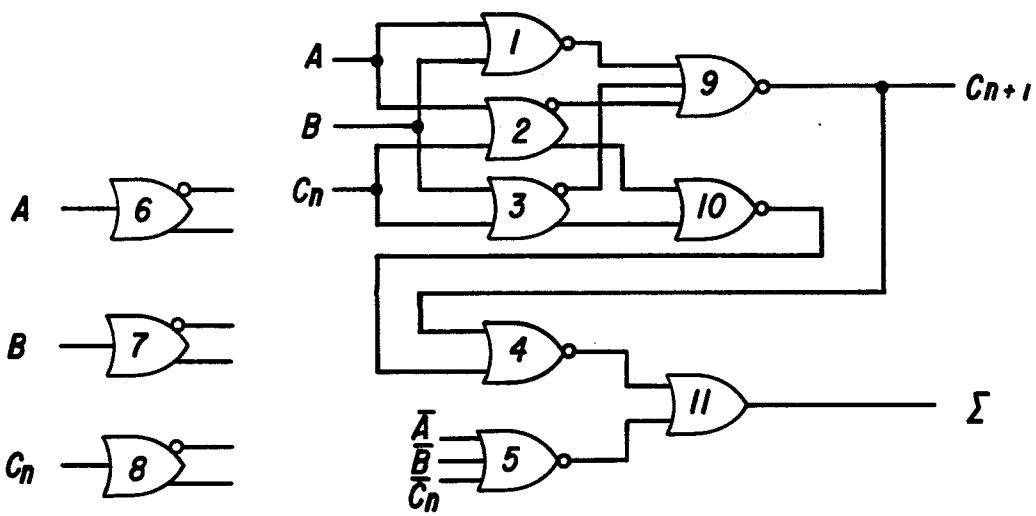
FIG. 3A shows an adder logic design required and FIG. 3B shows the array implementation thereof.
Figure 3B:
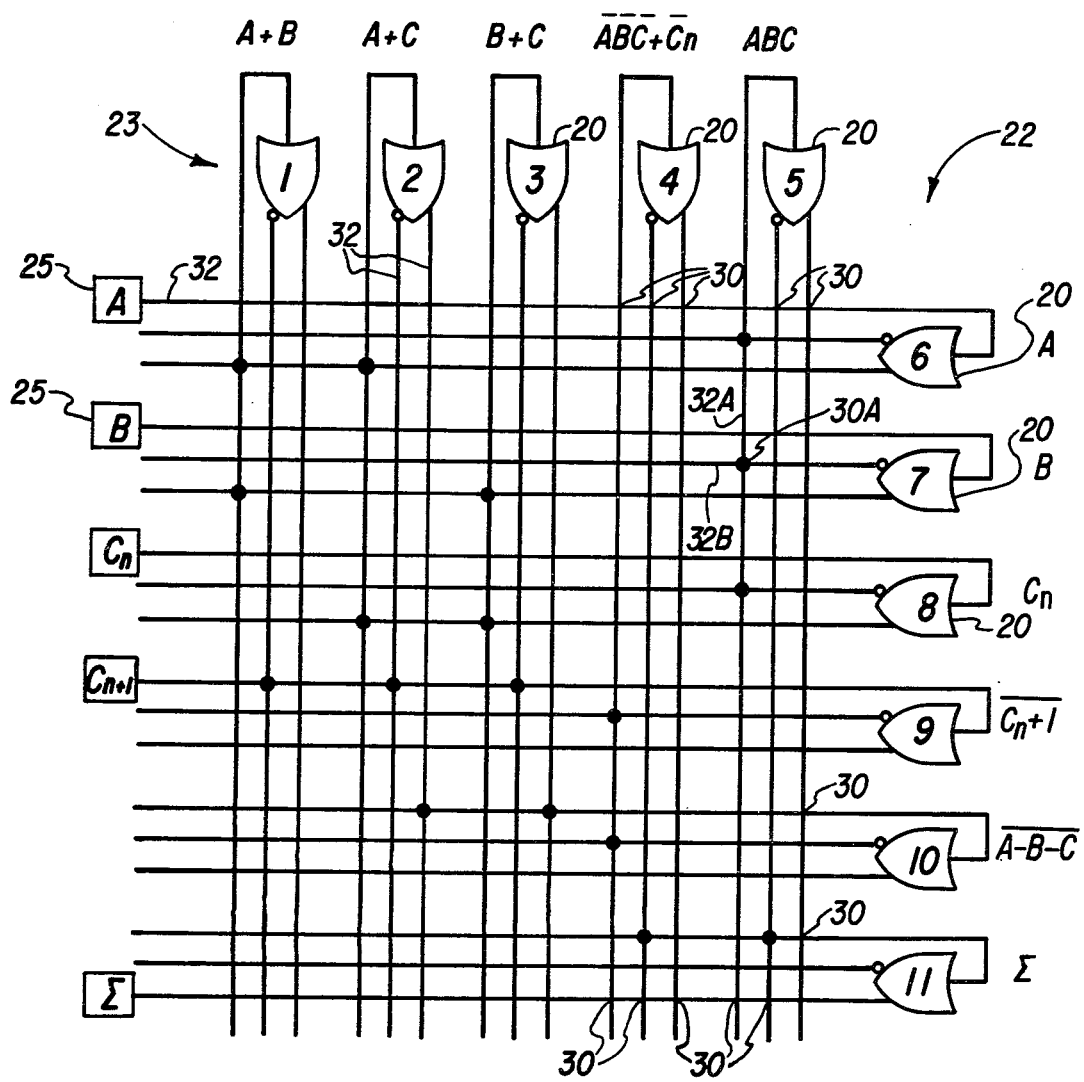

As a simple example, the logic full adder circuit of FIG. 3A can be implemented in accordance with the present invention. FIG. 3B shows a simplified portion of the logic array in accordance with the preferred embodiment with the proper mask vias to implement the full adder circuit of FIG. 3A. The intersection 30 of input/output lines 32 form interconnect cells 30. There, at each intersection 30, a diode (not shown) or other isolating circuitry buffers or isolates the various inputs to the logic elements. Where an input/output line 32A needs to be connected to another 32B, the interconnect cell 30A corresponding to the lines 32A, 32B is made electrically conductive to interconnect the lines 32A, 32B. These conducting interconnect cells 30A are shown as heavy dots in FIG. 3B. The net result of the various connections in the conducting interconnect cells 30A is the implementation of the logic circuit of FIG. 3A. In this example, each heavy dot 30A corresponds to one interconnect line in FIG. 3A.

Figure 4:
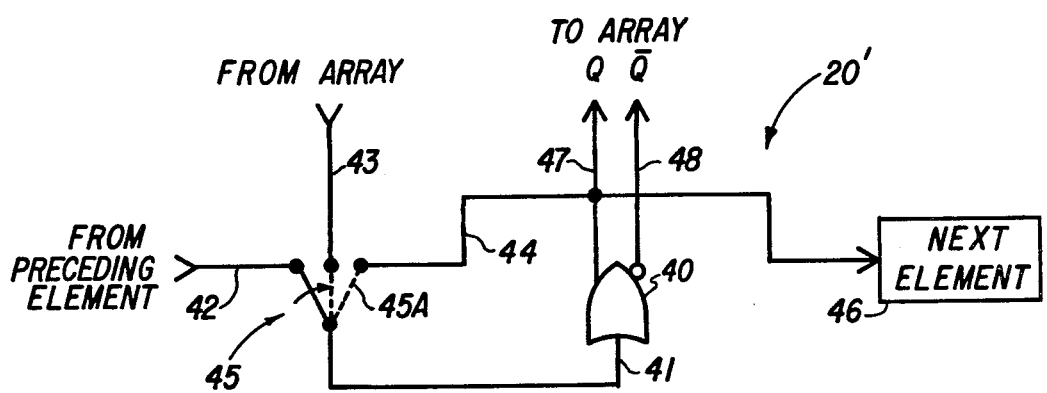
FIG. 4 shows the schematic implementation of the logic elements in the array in accordance with the preferred embodiment.

Because of the symmetrical arraying of the logic elements, testing of the array becomes a simple task. No specail or extra elements are required to be added to the array in order to implement a test program to test the logic array. The array in accordance with the invention can be tested with a shift register latch technique. FIG. 4 shows a schematic of a driver element 20'. An input line 41 to a complementary buffer 40 can be connected to three sources of input data through input lines 42, 43, 44 respectively. A three way switch 45, typically a gate or a clocked latch, controls the connection of line 41 to one of lines 42, 43, 44. In a first position, data from a preceding element are entered through input line 42. In a second position, data from a programmable logic array are entered through input line 43. In a third position, line 41 is connected to an output 47 of buffer element 40 to form a closed feedback path 44, 45A for latching the last logic state. Switch 45 responds to either a system clock, when it is operating as a gated latch, or to a test clock, when it is shifting in or out test patterns. When element 20' is operating as an asynchronous OR/NOR gate, the outputs 47, 48 are then fed back into the array to drive the inputs of other identical logic elements. At the end of each row or column of an element 22, 23, there is an interface terminal 25. Logic signals, such as those on lines 42 and 46, enter or leave the array chip by means of such interface terminals 25. This method allows a simple but fully exhaustive implementation of a shift register latch testing technique. Thus, a further advantage to the programmable logic array in accordance with the invention, in addition to simplicity in implementing a design, greater logic speed, and increased number of logic elements, is a built-in test capability without any special attention on the part of the logic designer.

Figure 5:
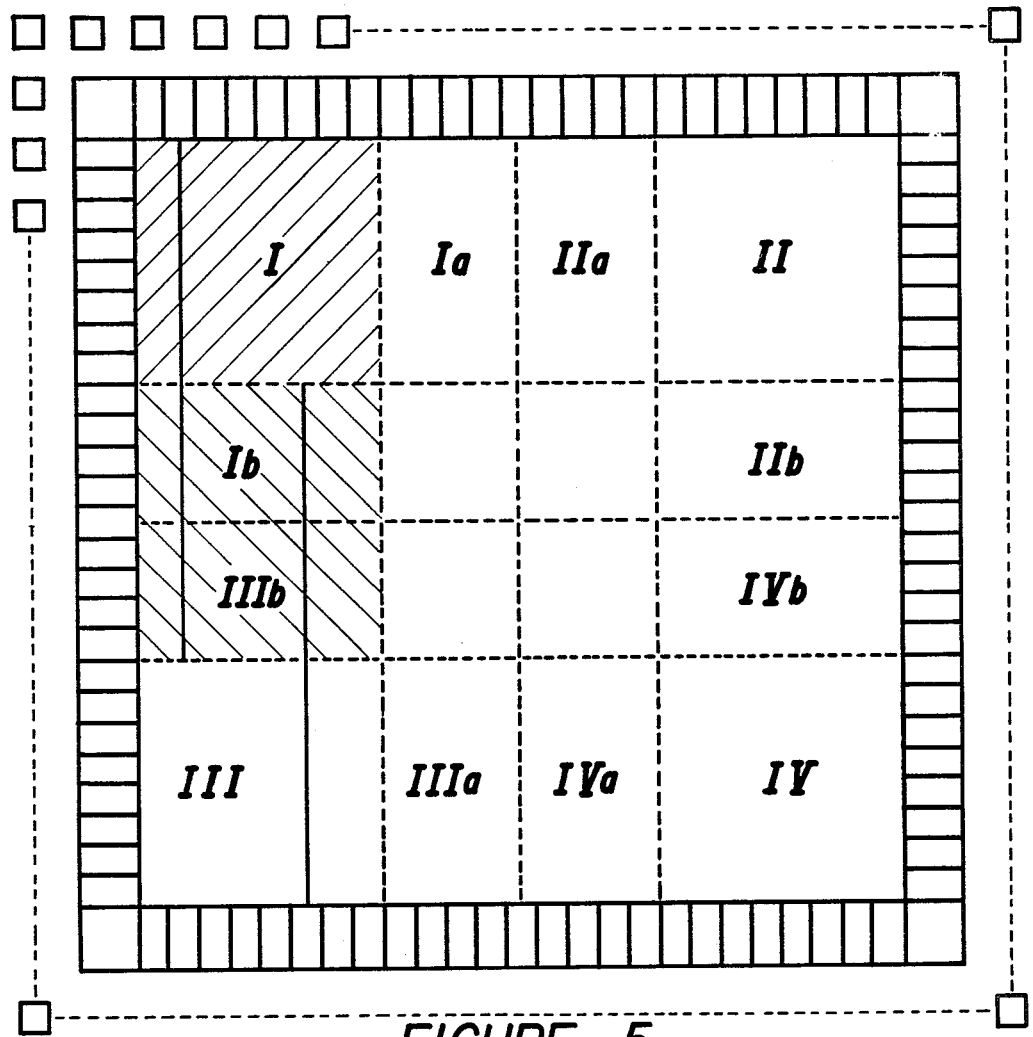
FIG. 5 is an example of partitioning the array in accordance with the preferred embodiment.

Because of the symmetry of the logic elements 20' and input/output terminals 25 to the PLA in accordance with the preferred embodiment of the invention, the PLA can be divided into smaller segments, or sub-PLA's, each having its own inputs and outputs within the segment. This is illustrated in FIG. 5, where the sub-PLA's are labeled in Roman numerals. With this type of partitioning, maximum usage of the PLA can be made. The partitioning can also have overlapping areas Ia and IIa, IIIa and IVa, Ib and IIIb, IIb and IVb. This is possible because of the interlacing symmetrical array of the logical elements 20'.

I claim:
1. A programmable logic array comprising:
   a substrate;
   a plurality of logic elements symmetrically arrayed around the periphery of a surface of said substrate for accepting and transmitting electrical signals;
   a plurality of input/output terminals symmetrically arrayed around the periphery of said surface and located adjacent to said array of logic elements;
   a plurality of first electrically conductive paths connected to and originating from each of said logic elements to form input and output lines, said first conductive paths spanning said substrate adjacent to said surface to terminate on the opposite side of said substrate, whereby said first conductive paths intersect one another;
   a plurality of second electrically conductive paths connected to and originating from each of said terminals and spanning said substrate adjacent to said surface to terminate on the opposite side of said substrate, whereby said second conductive paths intersect one another and said first conductive paths; and
   a plurality of interconnect cells formed by the intersection of said first conductive paths, by the intersection of said second conductive paths, and by the intersection of said first and second conductive paths, said cells comprising circuitry to isolate said first and second conductive paths, wherein said first and second conductive paths are selectively made to interconnect electrically by causing the corresponding interconnect cell to be electrically conductive.

2. The programmable logic array as in claim 1 wherein said logic elements comprise OR logic gates having complementary outputs.

3. The programmable logic array as in claim 2 wherein said logic elements further comprise a latch circuit coupled to said OR logic gate to provide said complementary outputs.

4. The programmable logic array as in claim 1 wherein each of said logic elements comprises:
   switching means having a plurality of selectable input lines for selectively connecting one of said selectable input lines to a common input line;
   a logic gate having an input port connected to said common input line;
   an output line from a preceding logic element in said array connected to one of said selectable input lines;
   an output line from said array connected to one of said selectable input lines;
   an output line from said logic gate connected to one of said selectable input lines and to an input line of said array; and
   an output line of said logic gate connected to a next logic element in said array thereby forming a selectably serial connection of a plurality of said logic elements in said array.

5. A logic element in a programmable logic array comprising:
   switching means having a plurality of selectable input lines for selectively connecting one of said selectable input lines to a common input line;
   a logic gate having an input port connected to said common input line;
   an output line from a preceding logic element in said array connected to one of said selectable input lines;
   an output line from said array connected to one of said selectable input lines;
   an output line from said logic gate connected to one of said selectable input lines and to an input line of said array; and
   an output line of said logic gate connected to a next logic element in said array, thereby forming a selectably serial connection of a plurality of said logic elements in said array.

6. A method of implementing a programmable logic array comprising the steps of:
   implementing logic elements by:
   (a) selectively interconnecting an output of a first OR gate having complementary outputs to an input of a second OR gate having complementary outputs; and
   (b) selectively interconnecting a flip-flop element between an input of said first OR gate and an output of said second OR gate;
   arraying symmetrically around the periphery of a surface of a substrate a plurality of said logic elements for accepting and transmitting electrical signals;
   arraying symmetrically around the periphery of said surface and adjacent to said plurality of logic elements a plurality of input/output terminals;
   connecting a plurality of first electrically conductive paths to each of said logic elements;
   spanning said plurality of first electrically conductive paths across said substrate adjacent to said surface and terminating said first conductive paths on the opposite side of said substrate to form intersections of said first conductive paths;
   connecting a plurality of second electrically conductive paths to each of said input/output terminals;
   spanning said plurality of second electrically conductive paths across said substrate adjacent to said surface and terminating said second conductive paths on the opposite side of said substrate to form intersections of said second conductive paths and intersections of said first and second conductive paths; and
   selectively causing said intersections of first conductive paths, intersections of second conductive paths, and intersections of first and second conductive paths to be electrically conducting, thereby making selective electrical interconnections among said first and second conductive paths.

7. A method of implementing a programmable logic array comprising the steps of:
   (a) implementing a plurality of logic elements comprising the substeps of:
      connecting a first latch element to an output of a first gate;
      connecting the output of said first latch element to an input of a second gate;
      connecting a second latch element to an output of said second gate; and
      selectively connecting a feedback path between an input of said first gate and an output of said second latch element;
   (b) arraying symmetrically around the periphery of a surface of a substrate a plurality of said logic elements for accepting and transmitting electrical signals;
   (c) arraying symmetrically around the periphery of said surface and adjacent to said plurality of logic elements a plurality of input/output terminals;
   (d) connecting a plurality of first electrically conductive paths to each of said logic elements;
   (e) spanning said plurality of first electrically conductive paths across said substrate adjacent to said surface and terminating said first conductive paths on the opposite side of said substrate to form intersections of said first conductive paths;
   (f) connecting a plurality of second electrically conductive paths to each of said input/output terminals;
   (g) spanning said plurality of second electrically conductive paths across said substrate adjacent to said surface and terminating said second conductive paths on the opposite side of said substrate to form intersections of said second conductive paths and intersections of said first and second conductive paths; and
   (h) selectively causing said intersections of first conductive paths, intersections of second conductive paths, and intersections of first and second conductive paths to be electrically conducting, thereby making selective electrical interconnections among said first and second conductive paths.

8. A method of implementing a logic element in a programmable logic array to provide a selectably serial connection of a plurality of said logic elements, comprising the steps of:

connecting an input port of a logic gate to a common input line of a switching means, said switching means having a plurality of selectable input lines for selectively connecting one of said selectable input lines to said common input line;

providing data from a preceding logic element in said array to one of said selectable input lines;

providing data from said array to one of said selectable input lines;

providing output data from said logic gate to one of said selectable input lines;

selecting one of said selectable input lines to connect to said common input line; and connecting an output line of said logic gate to a next logic element in said array, thereby forming a selectably serial connection of a plurality of said logic elements in said array.

9. A method of implementing a programmable logic array comprising the method of claim 8 for implementing a plurality of logic elements, further comprising the steps of:

arraying symmetrically around the periphery of a surface of a substrate a plurality of said logic elements for accepting and transmitting electrical signals;

arraying symmetricaly around the periphery of said surface and adjacent to said plurality of logic elements a plurality of input/output terminals;

connecting a plurality of first electrically conductive paths to each of said logic elements;

spanning said plurality of first electrically conductive paths across said substrate adjacent to said surface and terminating said first conductive paths on the opposite side of said substrate to form intersections of said first conductive paths;

connecting a plurality of second electrically conductive paths to each of said input/output terminals;

spanning said plurality of second electrically conductive paths across said substrate adjacent to said surface and terminating said second conductive paths on the opposite side of said substrate to form intersections of said second conductive paths and intersections of said first and second conductive paths; and selectively causing said intersections of first conductive paths, intersections of second conductive paths, and intersections of first and second conductive paths to be electrically conducting, thereby making selective electrical interconnections among said first and second conductive paths.

* * * * *